(12) United States Patent
Ito et al.

(10) Patent No.: US 7,279,259 B2
(45) Date of Patent: Oct. 9, 2007

(54) METHOD FOR CORRECTING PATTERN DATA AND METHOD FOR MANUFACTURING SEMICONDUCTOR DEVICE USING SAME

(75) Inventors: Takahisa Ito, Kawasaki (JP); Mitsuo Sakurai, Kawasaki (JP); Naoyuki Ishiwata, Kawasaki (JP); Yasuyuki Kushida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 131 days.

(21) Appl. No.: 11/102,689

(22) Filed: Apr. 11, 2005

(65) Prior Publication Data

US 2006/0141369 A1    Jun. 29, 2006

(30) Foreign Application Priority Data

Dec. 28, 2004   (JP) ............................. 2004-379438

(51) Int. Cl.
*G03F 9/00*   (2006.01)
(52) U.S. Cl. ............................. 430/30; 430/5; 430/311; 716/19; 716/21
(58) Field of Classification Search ................... 430/5, 430/30, 311; 716/19, 21
See application file for complete search history.

(56) References Cited

OTHER PUBLICATIONS

Patent Abstracts of Japan, Publication No. 2003-195478, dated Jul. 9, 2003.
Patent Abstracts of Japan, Publication No. 2002-006477, dated Jan. 9, 2002.

*Primary Examiner*—Christopher G. Young
(74) *Attorney, Agent, or Firm*—Westerman, Hattori, Daniels & Adrian, LLP.

(57) ABSTRACT

A method for correcting pattern data is provided which is capable of making a proper correction to data of a pattern having a complicated layout. A correction is made to pattern data affected by a proximity effect when a pattern is formed on a photomask or wafer according to design data for a semiconductor device, by detecting, according to the design data, a space portion being placed on a photomask or wafer and having a specified size occurring between patterns facing each other in a first direction, by producing pattern data corresponding to an assist pattern that fills the space portion, by detecting an edge to be corrected in a position being opposite to an edge of the assist pattern extending in a second direction between the patterns facing each other, out of framing portions of the pattern being placed in parallel and near to the assist pattern, by making a correction being independent of a correction to be made to other edge of the framing portion to the detected edge to be corrected, and by removing the assist pattern.

16 Claims, 22 Drawing Sheets

METHOD FOR CORRECTING PATTERN DATA AND METHOD FOR MANUFACTURING SEMICONDUCTOR DEVICE USING SAME

CROSS-REFERENCE TO RELATED APPLICATIONS

This application is based on, and claims priority to, Japanese Application No. 2004-379438, filed Dec. 28, 2004, the entire contents of which are incorporated herein by reference.

BACKGROUND OF THE INVENTION

1. Field of the Invention

The present invention relates to a method for making a correction to pattern data and a method for manufacturing semiconductor devices, and particularly to the method for making the correction to pattern data affected by a proximity effect when a pattern is formed on a photomask or wafer and the method for manufacturing semiconductor devices using the above method.

2. Description of the Related Art

In recent years, patterns to be formed by photolithography employed in processes of manufacturing leading-edge semiconductor devices are being made fine and highly-integrated. As a result, a problem occurs in that, in the formation of a pattern with an exposure wavelength or less, due to an adverse influence by a proximity effect, a shape of a mask pattern using a photomask (hereinafter simply referred to as a "mask") does not coincide with that of a resist pattern obtained by transferring the mask pattern on a wafer.

Also, in the etching process for microfabrication of a front-end layer using a resist pattern on which the mask pattern has been transferred, due to a loading effect which leads to variations in a conversion difference caused by a difference in a pattern shape and a pattern density, a phenomenon occurs that a shape of a resist pattern does not coincide with that of a microfabricated pattern for the front-end layer obtained by the selective etching process.

To solve this problem and to obtain a pattern having a desired dimension and shape, an OPC (Optical Proximity Correction) technology in which a required amount of correction is added to mask pattern data is being employed generally in recent years. To obtain an effect of the OPC technology, it is necessary that a difference between a finally-obtained dimension of a mask pattern and a dimension in mask pattern data is made as small as possible. In the formation of a mask to be used for manufacturing recent leading-edge semiconductor devices in particular, very extremely high accuracy in its linearity, in difference of pattern density, or the like is required. However, at present, it is difficult to satisfy the demand for such extremely high accuracy only by improvement of mask producing processes. This holds true for manufacturing a mask using a nega-type resist in particular. The process of manufacturing a mask using a nega-type resist is employed when a mask for a gate layer requiring extremely high accuracy is produced, thus presenting a serious problem.

A method for correcting such a dimensional error by using the OPC technology is disclosed in, for example, Japanese Unexamined Patent Publication No. 2003-195478. In this method, so-called rule-based OPC technology is applied to a mask process. According to this method, a correlation between a space dimension among adjacent patterns and a dimensional change in a pattern itself is first determined and, by using this result, a necessary dimensional correction is made to mask pattern data.

However, the conventional method disclosed in Japanese Unexamined Patent Publication No. 2003-195478 has a problem that the process in the method has a favorable correcting effect on a simple pattern if including only a line pattern and space, but adversely affects a pattern having a complicated layout.

SUMMARY OF THE INVENTION

In view of the foregoing, it is an object of the present invention to provide a method for correcting pattern data which is capable of making a proper correction to data of a pattern having a complicated layout.

It is another object of the present invention to provide a method for manufacturing a semiconductor device which enables a desired microfabricated pattern to be obtained.

According to one aspect of the present invention, there is provided a pattern data correcting method for making a correction to pattern data affected by a proximity effect when a pattern is formed on a photomask or wafer according to design data for a semiconductor device, including the steps of: detecting, according to the design data, a space portion being placed on the photomask or wafer and having a specified size occurring between patterns facing each other in a first direction; producing a pattern data corresponding to an assist pattern that fills the space portion; detecting an edge to be corrected in a position being opposite to an edge of the assist pattern extending in a second direction between the patterns facing each other, out of framing portions of the pattern being placed in parallel and near to the assist pattern; making a correction being independent of a correction to be made to other edge of the framing portions to the detected edge to be corrected; and removing the assist pattern.

According to another aspect of the present invention, there is provided a pattern data correcting method for making a correction to pattern data affected by a proximity effect when a pattern is formed on a photomask or wafer according to design data for a semiconductor device, including the steps of: extracting a region, as an isolated edge, in which a space portion occurring between second patterns facing each other exists within a specified distance in a first direction, out of edges in framing portions of a first pattern; producing pattern data corresponding to an assist pattern that fills the space portion; extracting an edge of the assist pattern extending between the first and second patterns facing each other in a second direction; making a correction to data of the isolated edge according to a length of the edge of the assist pattern and an interval between the assist pattern and the isolated edge; and removing the assist pattern.

According to still another aspect of the present invention, there is provided a method for manufacturing a semiconductor device including the step of: performing exposures by using a photomask formed, with an aim of making a correction to pattern data affected by a proximity effect when a pattern is formed on a photomask or wafer according to design data for a semiconductor device, by detecting, according to the design data, a space portion being placed on the photomask or wafer and having a specified size occurring between patterns facing each other in a first direction, by producing a pattern data corresponding to an assist pattern that fills the space portion, by detecting an edge to be corrected in a position being opposite to an edge of the assist pattern extending in a second direction between the patterns facing each other, out of framing portions of the pattern being placed in parallel and near to the assist pattern, by making a correction being independent of a correction to be made to other edge of the framing portion to the detected edge to be corrected, and by removing the assist pattern.

According to still another aspect of the present invention, there is provided a method for manufacturing a semiconductor device including the step of: performing exposures by using a photomask formed, with an aim of making a correction to pattern data affected by a proximity effect when a pattern is formed on a photomask or wafer according to design data for a semiconductor device, by extracting a region, as an isolated edge, in which a space portion occurring between second patterns facing each other exists within a specified distance in a first direction, out of edges in framing portions of a first pattern, by producing pattern data corresponding to an assist pattern that fills the space portion, by extracting an edge of the assist pattern extending between the first and second patterns facing each other in a second direction, by making a correction to data of the isolated edge according to a length of the edge of the assist pattern and an interval between the assist pattern and the isolated edge and by removing the assist pattern.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
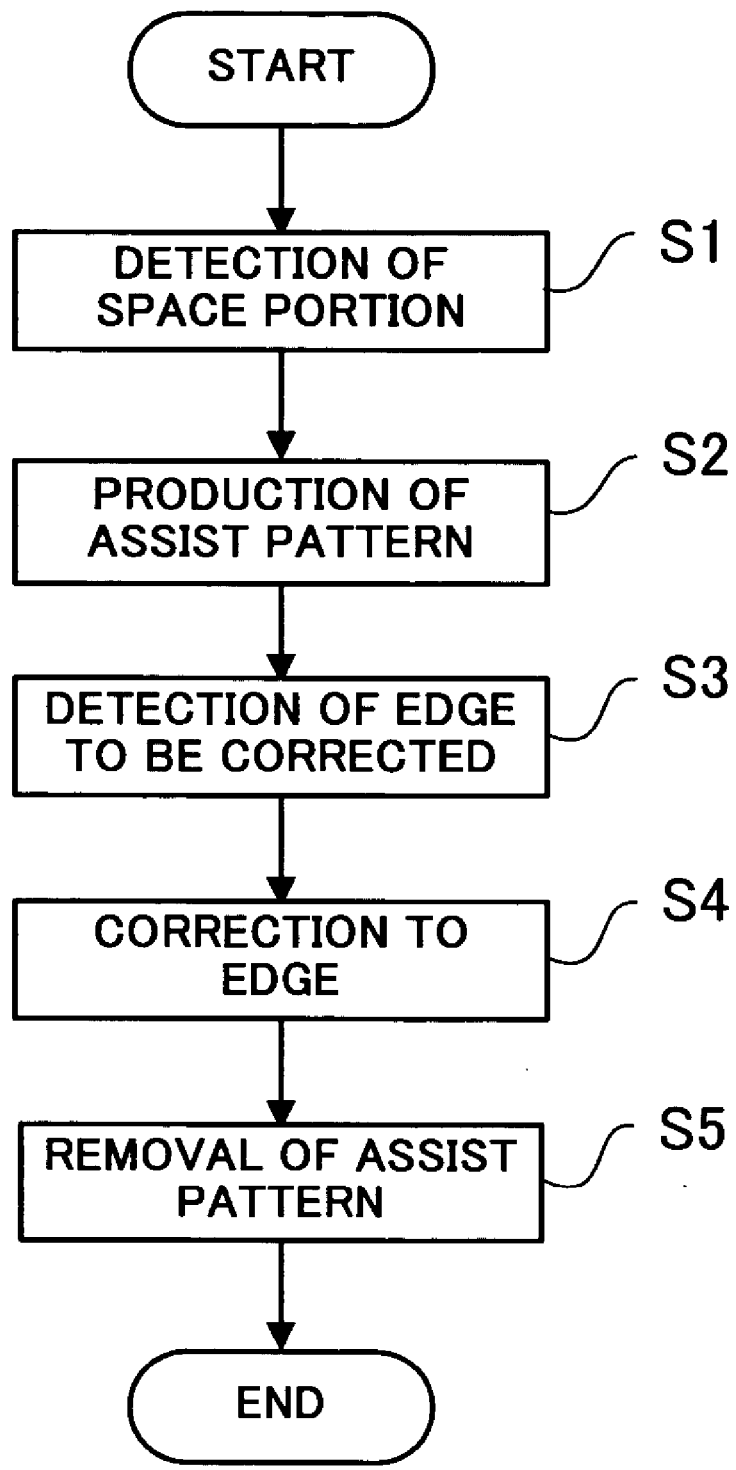
FIG. 1 shows schematically a method for correcting pattern data according to an embodiment of the present invention.

FIG. 1 shows schematically a method for correcting pattern data according to an embodiment of the present invention.

Figure 2:
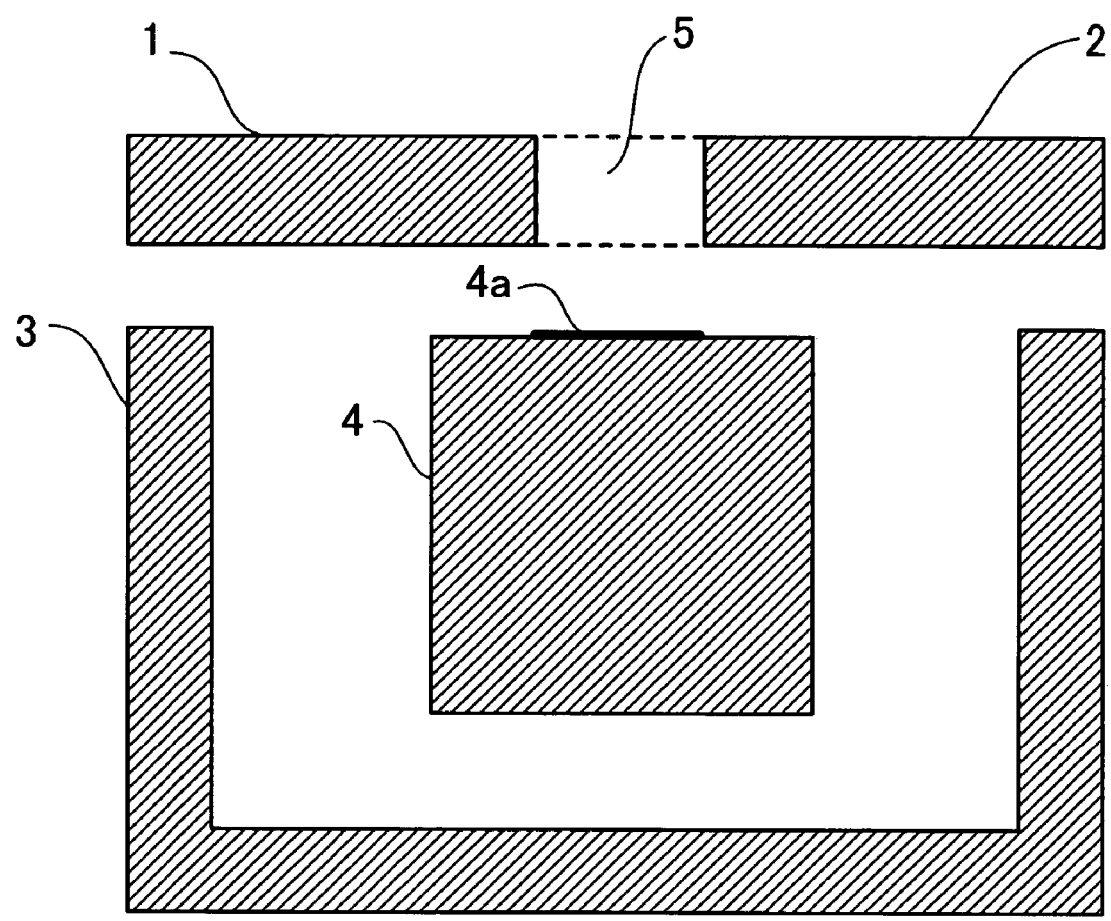
FIG. 2 shows an example of a pattern.

FIG. 2 shows an example of a pattern.

A method is described for making a correction to pattern data affected by a proximity effect when such a pattern as shown in FIG. 2 is formed on a photomask below.

When a proximity-effect correction is made by the conventional method to design data having patterns 1, 2, 3, and 4 as shown in FIG. 2, since other pattern does not exist in a direction opposite to, for example, the edge 4a of the pattern 4, the pattern 4 is recognized as an isolated pattern according to an ordinary proximity-effect correction rule (Line & Space), no correction is made to the pattern 4. However, if there are patterns each having a complicated layout in a dense state, etching progress less easily in this area and, therefore, a pattern dimension of the edge 4a becomes larger than a desired dimension as in the case of other edges. Due to this, no proper correction is made and such dimensional errors occur.

In the pattern data correcting method shown in FIG. 1, such design data as having the patterns 1, 2, 3, and 4 shown in FIG. 2, is read to detect a space portion 5 with a specified size occurring among patterns facing one another (Step S1). The space portion 5 is detected according to a designated rule (described in detail later).

Figure 3:
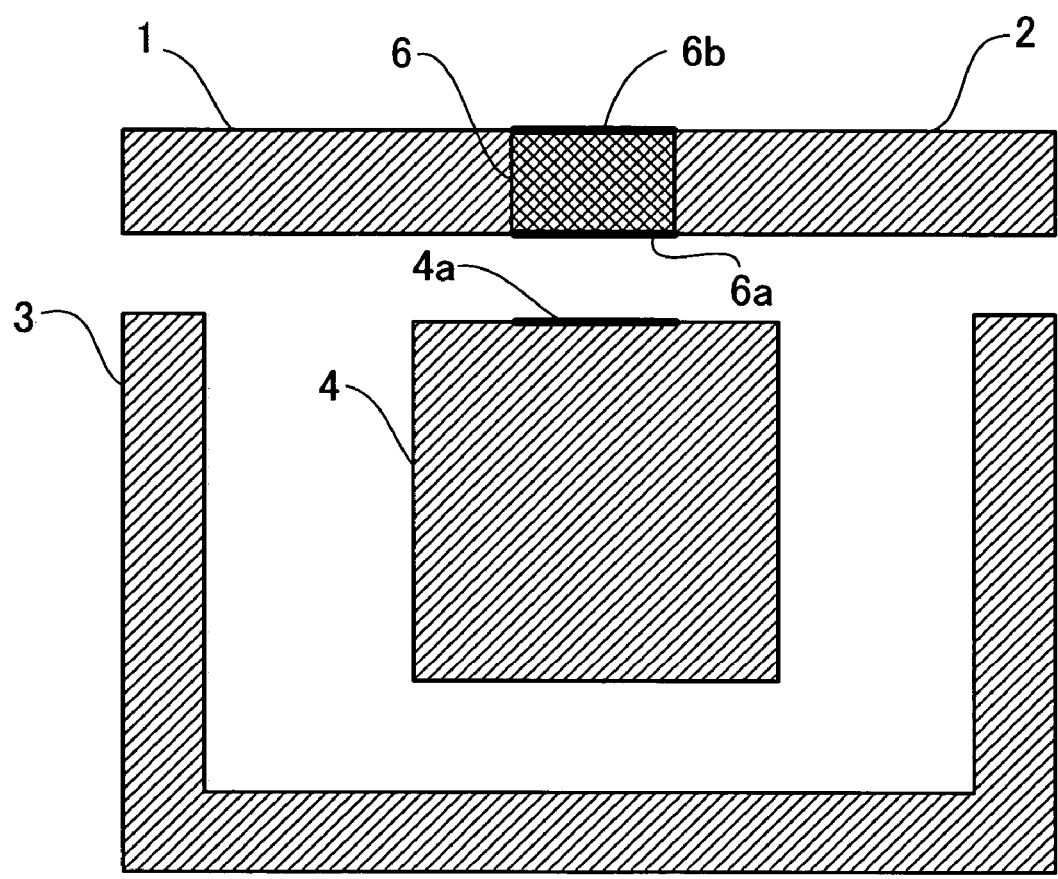
FIG. 3 shows a state in which an assist pattern has been produced.

Next, pattern data corresponding to an assist pattern that fills the detected space portion 5 is produced (Step S2). FIG. 3 shows a state in which an assist pattern has been produced. As shown in FIG. 3, the assist pattern 6 is produced in the space portion 5 between the patterns 1 and 2. The edge 4a positioned opposite to edges 6a and 6b of the assist pattern 6 extending in a direction of a distance between the patterns 1 and 2 facing each other, out of framing portions of the pattern 4 placed in parallel and near to the assist pattern 6, is detected as an edge to be corrected (Step S3). A correction is made to the detected edge 4a independently of the correction to be made to other edge in the framing portions of the pattern 4 (Step 4). More specifically, the correction is made to the detected edge 4a by applying a correction value corresponding to a distance from the assist pattern 6 or to a distance between the patterns 1 and 2 (described in detail later). Finally, the assist pattern 6 is removed (Step S5).

By using the pattern data correcting method described above, a proper correction can be made to even an edge which is ordinarily handled as an isolated pattern and to which no proper correction is made.

The pattern data correcting method is explained in detail below. The pattern data correcting method described below is realized by operations of a CPU (Central Processing Unit) according to an algorithm of software installed in, for example, a computer.

Figure 4:
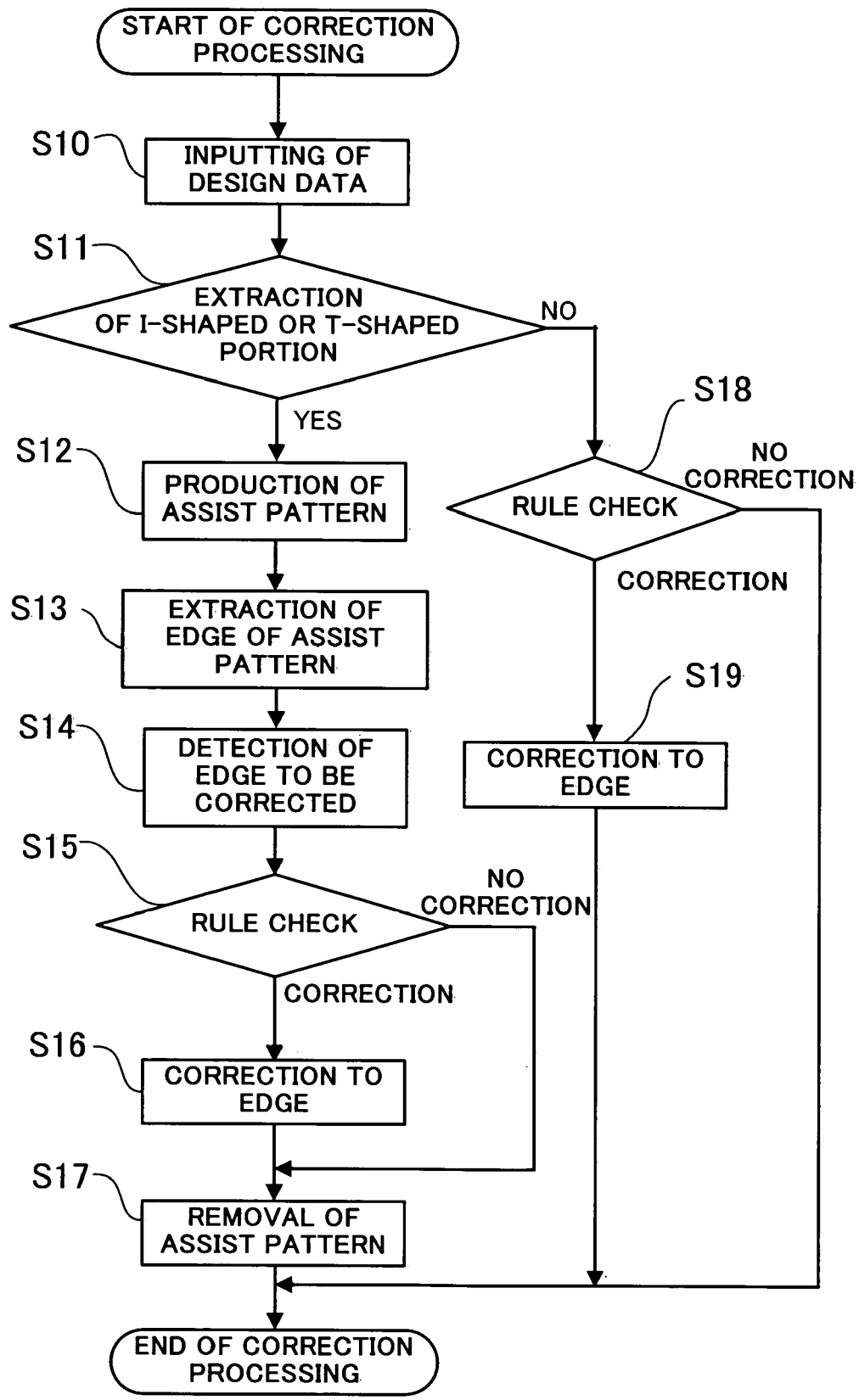
FIG. 4 shows a flowchart indicating a flow of processes of a pattern data correcting method of a first embodiment of the present invention.

FIG. 4 shows a flowchart indicating a flow of processes of the pattern data correcting method of a first embodiment of the present invention. First, after design data to produce an original drawing is input (Step S10), in order to detect the space portion 5 as shown in FIG. 2, a portion in which patterns face each other in an I-shaped manner or in a T-shaped manner is extracted (Step S11). More specifically, patterns placed as shown in FIG. 5 or 6 are defined respectively as an I-shaped portion or T-shaped portion and are extracted.

Figure 5:
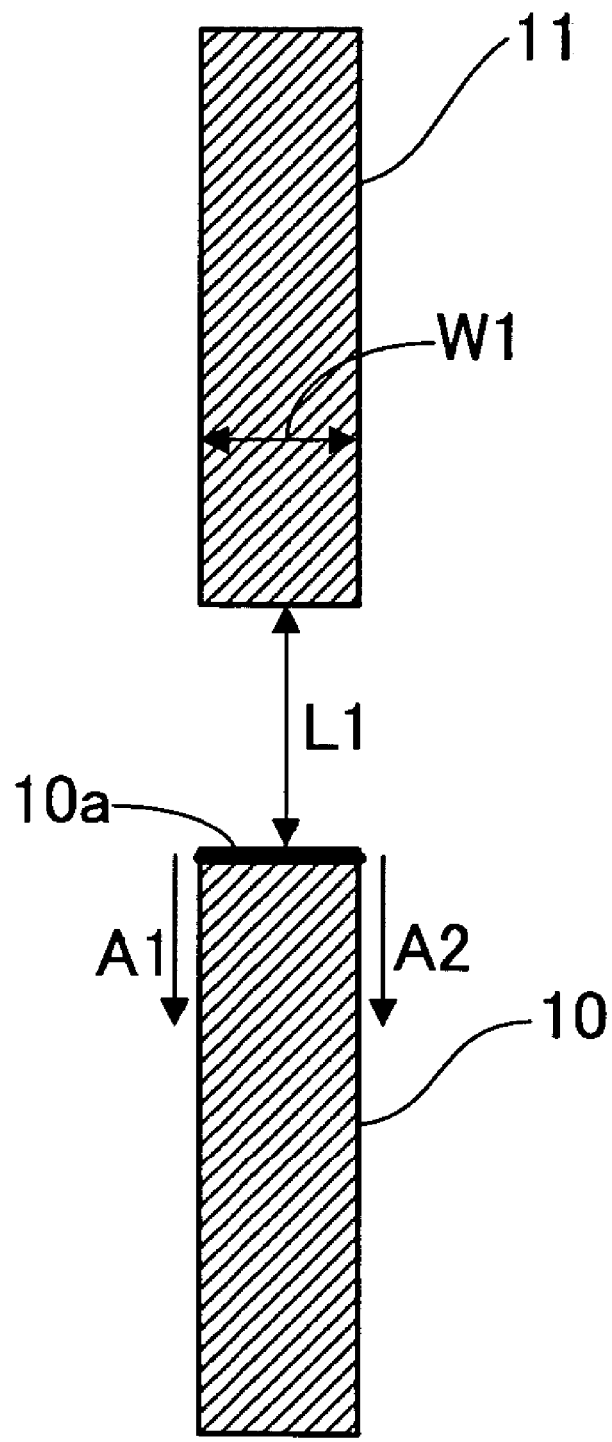
FIG. 5 shows one example to define an I-shaped or T-shaped portion.

FIG. 5 shows one example to define an I-shaped or T-shaped portion.

First, an end 10a of a pattern 10 having a specified length or more in directions of arrows A1 and A2 under a condition is recognized. When another pattern 11 exists within a specified distance L1 (for example, within 2000 nm), the pattern 11 and pattern 10 facing each other are recognized as an I-shaped portion. Moreover, if a width W1 of the pattern 11 is larger than a value, the pattern 11 and pattern 10 facing each other is recognized as a T-shaped portion. In the example shown in FIG. 2, the patterns 1 and 2 facing each other are recognized as an I-shaped portion.

Figure 6:
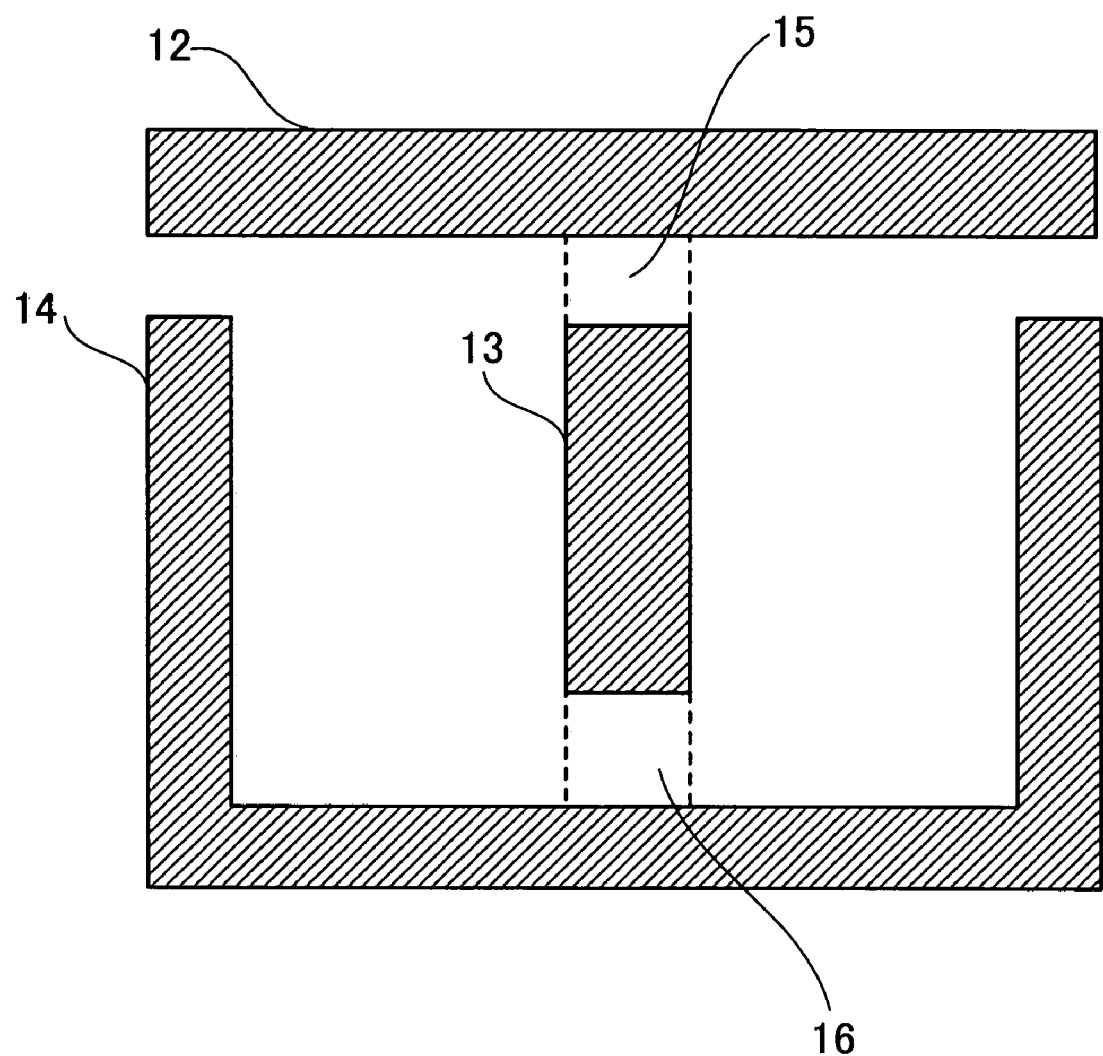
FIG. 6 shows an example of patterns that are recognized as a T-shaped portion.

FIG. 6 shows an example of patterns that are recognized as a T-shaped portion. In the example, the T-shaped portion formed by patterns 12 and 13 and the T-shaped portion formed by patterns 13 and 14 are extracted and space portions 15 and 16 occurring in areas in which the patterns 12 and 13 face each other and the patterns 13 and 14 face each other are detected.

Moreover, if neither the I-shaped nor T-shaped portion is extracted in the process in Step S11 in FIG. 4, the routine proceeds to Step S18. When the I-shaped or T-shaped portion is extracted, an assist pattern (see FIG. 3) that fills the space portion detected in its I-shaped or T-shaped portion is produced (Step S12). Furthermore, pattern data, by being defined by a layer (variable or the like) being different from design data of an original drawing (real pattern), can be easily erased at time of actual production of a mask pattern or be easily differentiated from the design data for a real pattern.

Next, the edge of the assist pattern extending in a direction between patterns facing each other is extracted (Step S13). Here, in the assist pattern 6 as shown in FIG. 3, edges 6a and 6b extending in a direction of a distance (hereinafter called a butting interval) between the patterns 1 and 2 are detected.

Thereafter, the edge positioned opposite to edges of the assist pattern extending in a direction of a distance between the patterns facing each other, out of framing portions of the pattern being placed in parallel and near to the detected assist pattern is detected as an edge to be corrected (Step S14). More specifically, by detecting a difference between pattern data of the assist pattern with layer definition performed and real pattern data and, as shown in FIG. 3, by extracting an area positioned opposite to the edge 6a and having the same length as that of the edge 6a, out of framing portions of the pattern 4 being the real pattern being placed in parallel and near to the assist pattern 6, the edge 4a to be corrected is detected.

Next, after a rule check is made, whether or not a correction is made to the detected edge to be corrected is judged (Step S15). In this rule check, unlike in the case of the ordinary proximity-effect correction rule (Line & Space), for example, in the case of the pattern data shown in FIG. 3, whether or not the correction is made to the edge 4a is judged according to a length of the edge 6a (that is; butting interval) and an interval (space width) between the edge 6a and the edge 4a of the pattern data 4 facing each other.

If it is judged that the edge to be corrected requires a correction, a correction value is determined according to a butting interval and a space width to make the correction to the edge 4a (Step S16). Here, the correction may be made by referring to a table in which correction values predetermined according to the butting interval and the space width are stored. Thereafter, the produced assist pattern is removed (Step S17) and the correction processing is terminated. Moreover, if it is judged, for example, due to the large space width and butting interval, that the edge to be corrected requires no correction, the correction is not made and, after the completion of the process in Step S17, the correction processing is terminated.

On the other hand, in the process in Step S11, when an I-shaped or T-shaped portion that can meet conditions is not detected, whether or not a correction is made is judged according to the ordinary proximity-effect correction rule (Line & Space)(Step S18) and, if the correction is to be made, a correction value is determined and according to space and line dimensions and the correction is made to the edge (Step S19). If it is judged that no correction is required, the correction processing is terminated without making the correction.

Thus, by extracting a portion in which patterns face each other in an I-shaped or T-shaped manner under a specified condition, the space portion 5 that influences on the edge 4a as shown in FIG. 2 can be detected effectively. By making a correction being independent of a correction to be made to other edge in framing portions of the pattern 4, to the edge 4a, a proper correction can be made even to data of a pattern having a complicated layout and being affected by a proximity effect.

Figure 7:
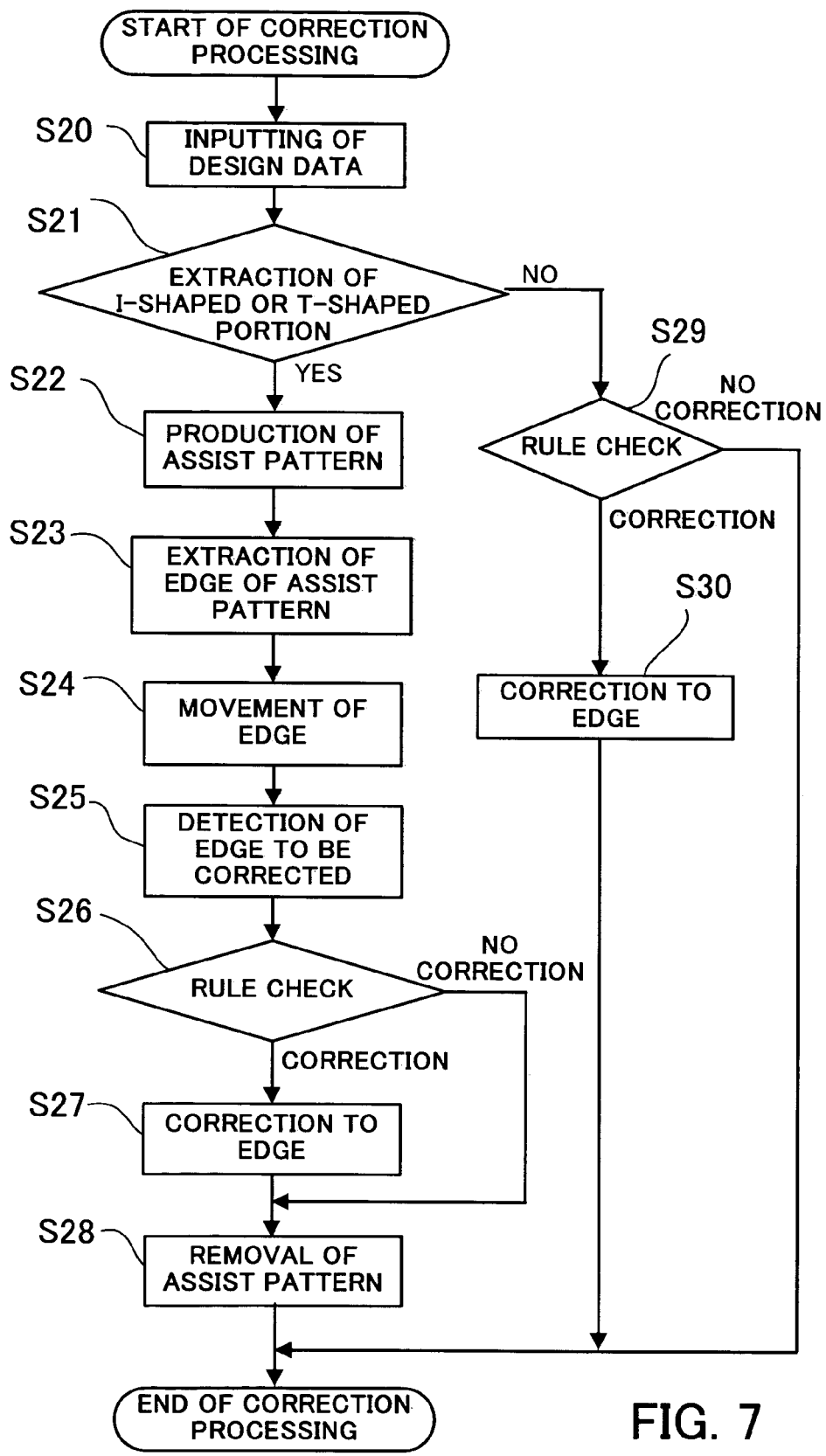
FIG. 7 shows a flowchart indicating a flow of processes of a pattern data correcting method of a second embodiment of the present invention.

Next, a method for correcting pattern data of a second embodiment is explained. FIG. 7 shows a flowchart indicating a flow of processes of a pattern data correcting method of the second embodiment of the present invention. The processes in Steps S20 to S23 in the second embodiment are the same as those shown in Steps S10 to S13 in FIG. 4 in the pattern data correcting method of the first embodiment. In the second embodiment of the present invention, the process in Step S24 is provided in which an edge of the assist pattern extracted in Step S23 is moved so as to be in contact with a pattern being placed in parallel and near to the assist pattern.

Figure 8:
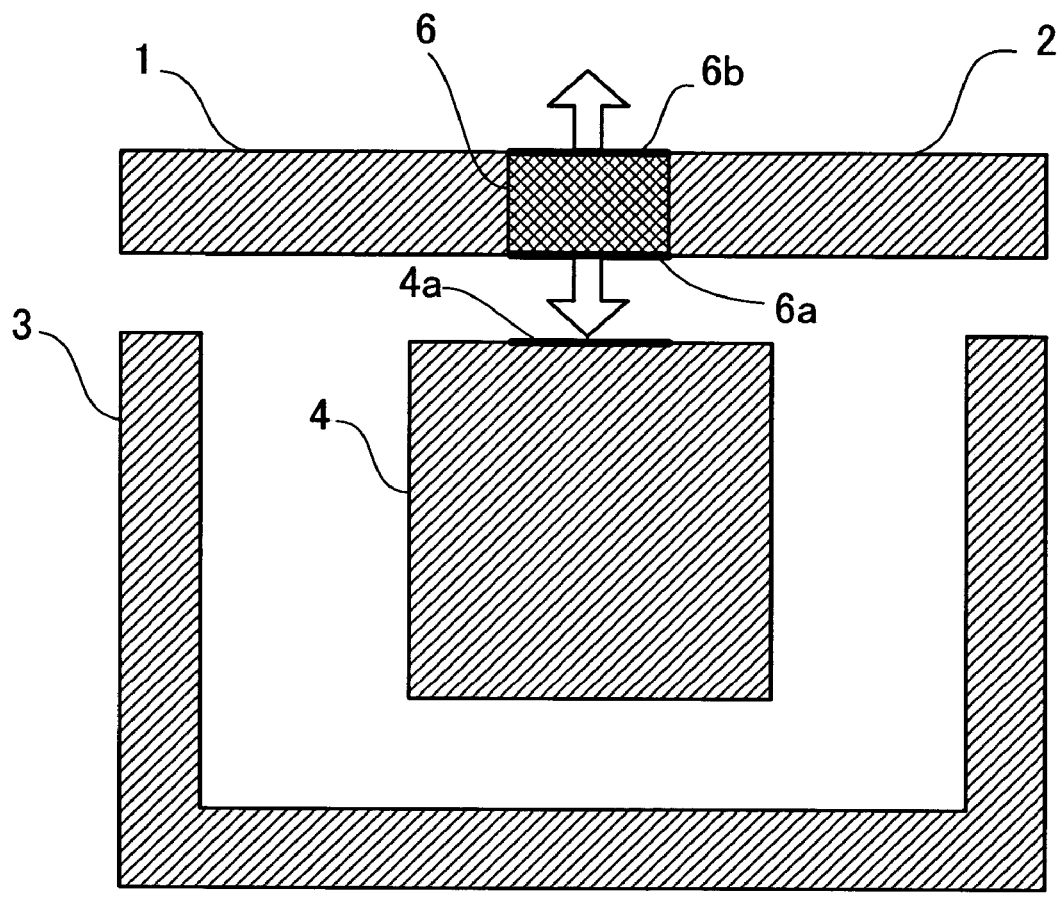
FIG. 8 shows a state in which an edge of an assist pattern is moved.

FIG. 8 shows a state in which an edge of an assist pattern is moved. Each of the edges 6a and 6b of the assist pattern 6 is moved respectively in one of directions of arrows. At this time point, the edge 6a, since the pattern 4 being a real pattern exists in a position facing the edge 6a, comes in contact with the pattern 4 when the edge 6a moves for a specified distance. Then, by extracting the region where the edge 6a has come in contact with the edge 4a, an edge to be corrected is detected (Step S25).

Furthermore, in the rule check in Step S26, by detecting a butting interval and a distance for which the edge 6a of the assist pattern 6 has been moved by the process in Step S24, a judgment is made as to whether or not the edge 4a is to be corrected. If the edge 4a is to be corrected, a correction value is determined according to the butting interval and the distance for which the edge 6a of the assist pattern 6 has been moved and then a correction is made to the edge 4a (Step S27). After that, the produced assist pattern 6 is removed (Step S28) and the correction processing is terminated. If it is judged that no correction to the edge to be corrected is required, after the completion of the process in Step S28, the correction processing is terminated without making the correction. The processes in Steps S29 and S30 are the same as those in Steps S18 and S19 shown in FIG. 4.

Next, a pattern data correcting method of a third embodiment of the present invention is explained.

Figure 9:
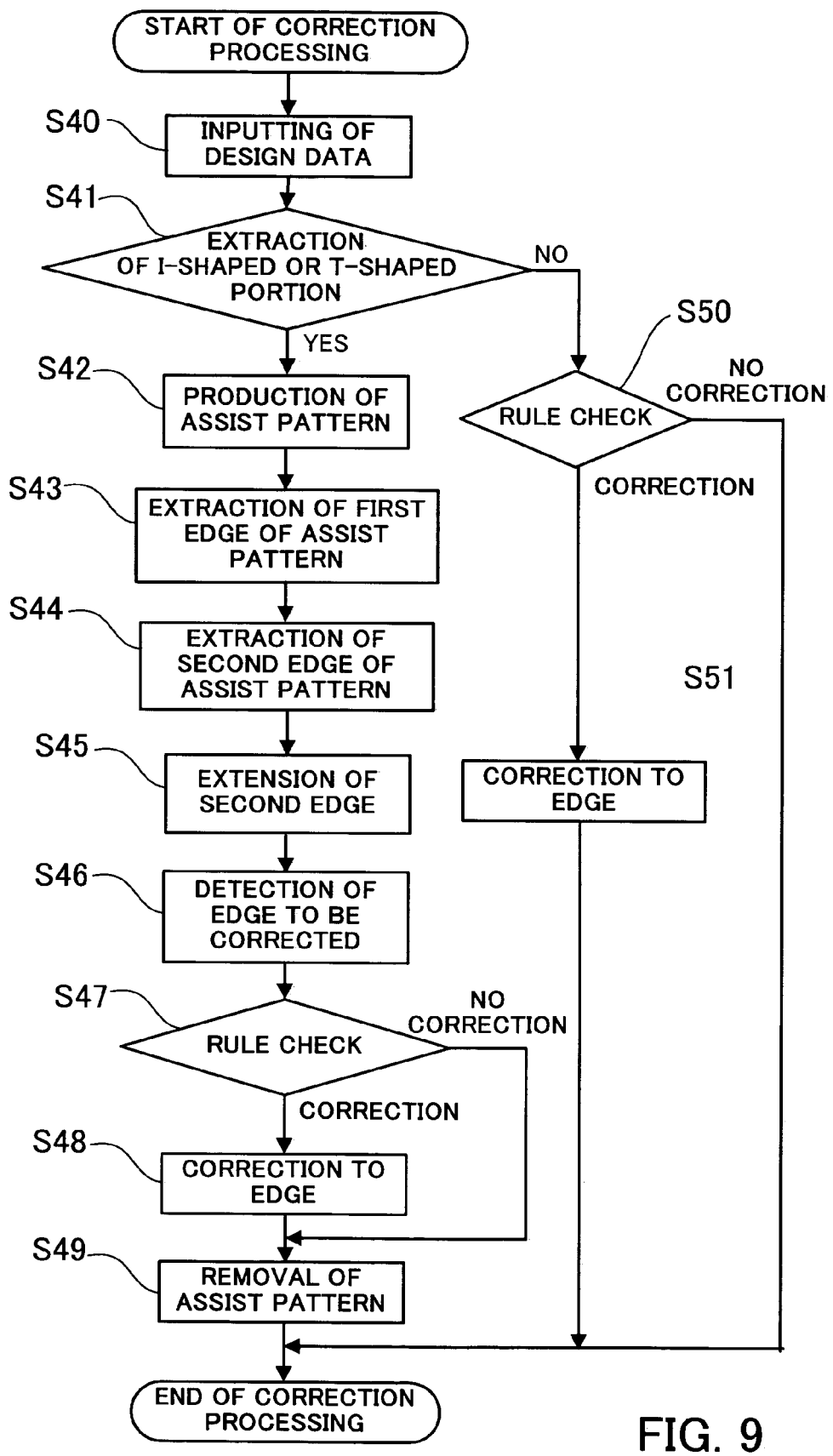
FIG. 9 shows a flowchart indicating a flow of processes of a pattern data correcting method of a third embodiment of the present invention.

FIG. 9 shows a flowchart indicating a flow of processes of a pattern data correcting method of the third embodiment of the present invention. The processes in Steps S40 to S42 in the third embodiment are the same as those shown in Steps S10 to S12 in FIG. 4 in the pattern data correcting method of the first embodiment.

In the pattern data correcting method of the third embodiment, after an edge (called a first edge in the third embodiment) extending in a direction of a distance between patterns facing each other has been extracted in Step S43, a second edge being vertical to the first edge is further extracted (Step S44). Then, by extending the second edge (Step S45), an edge to be corrected is detected (Step S46).

Figure 10:
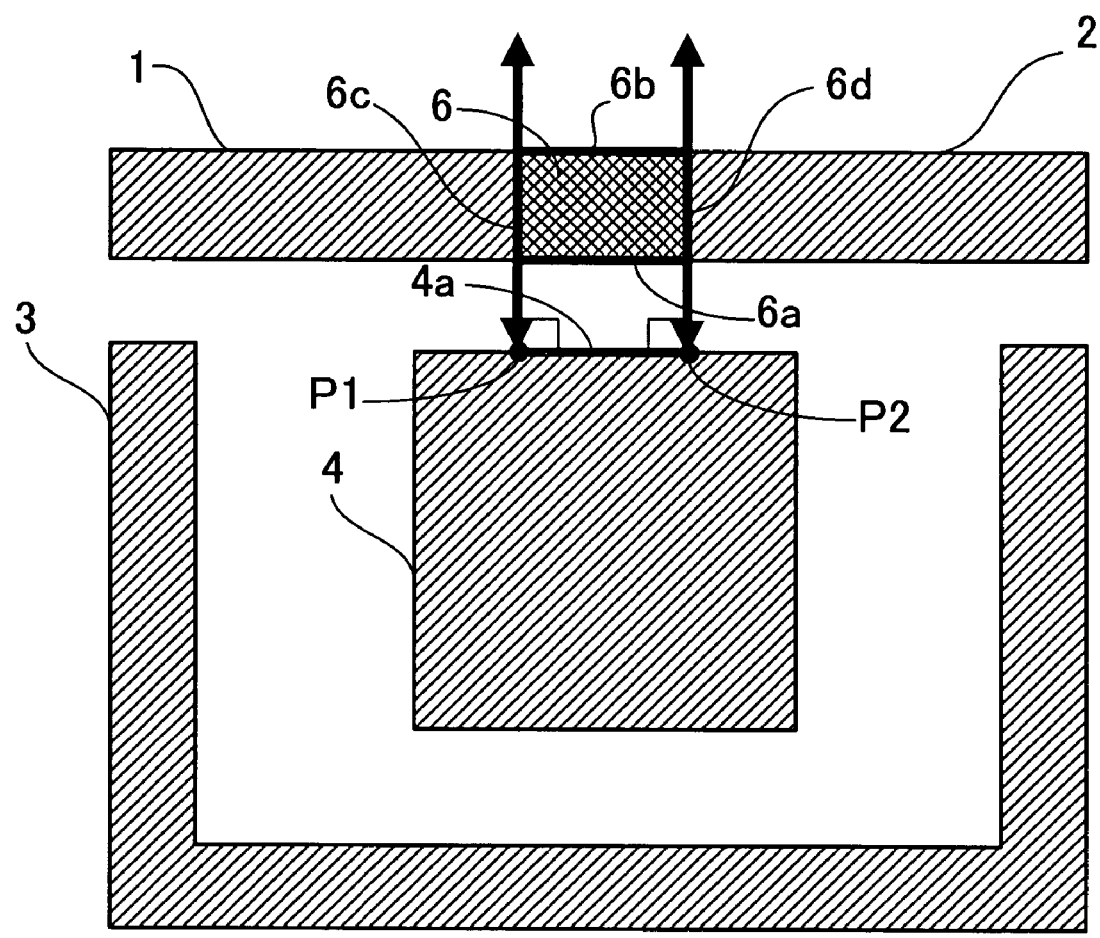
FIG. 10 shows a state in which an edge to be corrected is detected by extending a second edge of an assist pattern.

FIG. 10 shows a state in which an edge to be corrected is detected by extending the second edge of the assist pattern. As shown in FIG. 10, the second edges 6c and 6d being vertical to the first edges 6a and 6b of the assist pattern 6 are defined and the second edges 6c and 6d are extended. The second edges 6c and 6d, when extending for a specified distance, come in contact with the pattern 4 placed in parallel and near to the assist pattern 6. At this time point, by extracting a region sandwiched between two points P1 and P2 having been in contact with each other, the edge 4a to be corrected can be detected.

Furthermore, in the rule check in Step S47, by checking a butting interval and distance for which the second edges 6c and 6d having been extended in Step S45 come to contact with the pattern 4, a judgment is made as to whether or not the edge 4a is to be corrected. If the edge 4a is to be corrected, a correction value is determined according to the butting interval and distance for which the second edges 6c and 6d having been extended come to contact with the pattern 4, and the edge 4a is corrected (Step S48).

Here, the correction value of the edge 4a to be corrected may be determined according to an angle which the extended second edges 6c and 6d form with the edge 4a to be corrected of the pattern 4. For example, a correction table created by using this angle as a parameter to determine the necessity of correction and/or a correction value may be employed as a reference.

Then, the produced assist pattern is removed (Step S49) and the correction processing is terminated. Moreover, if it is judged that no correction to the edge to be corrected is required, after the completion of the process in Step S49, the correction processing is terminated without making the correction. The processes in Steps S50 and S51 are the same as those in Steps S18 and S19 shown in FIG. 4.

Figure 11:
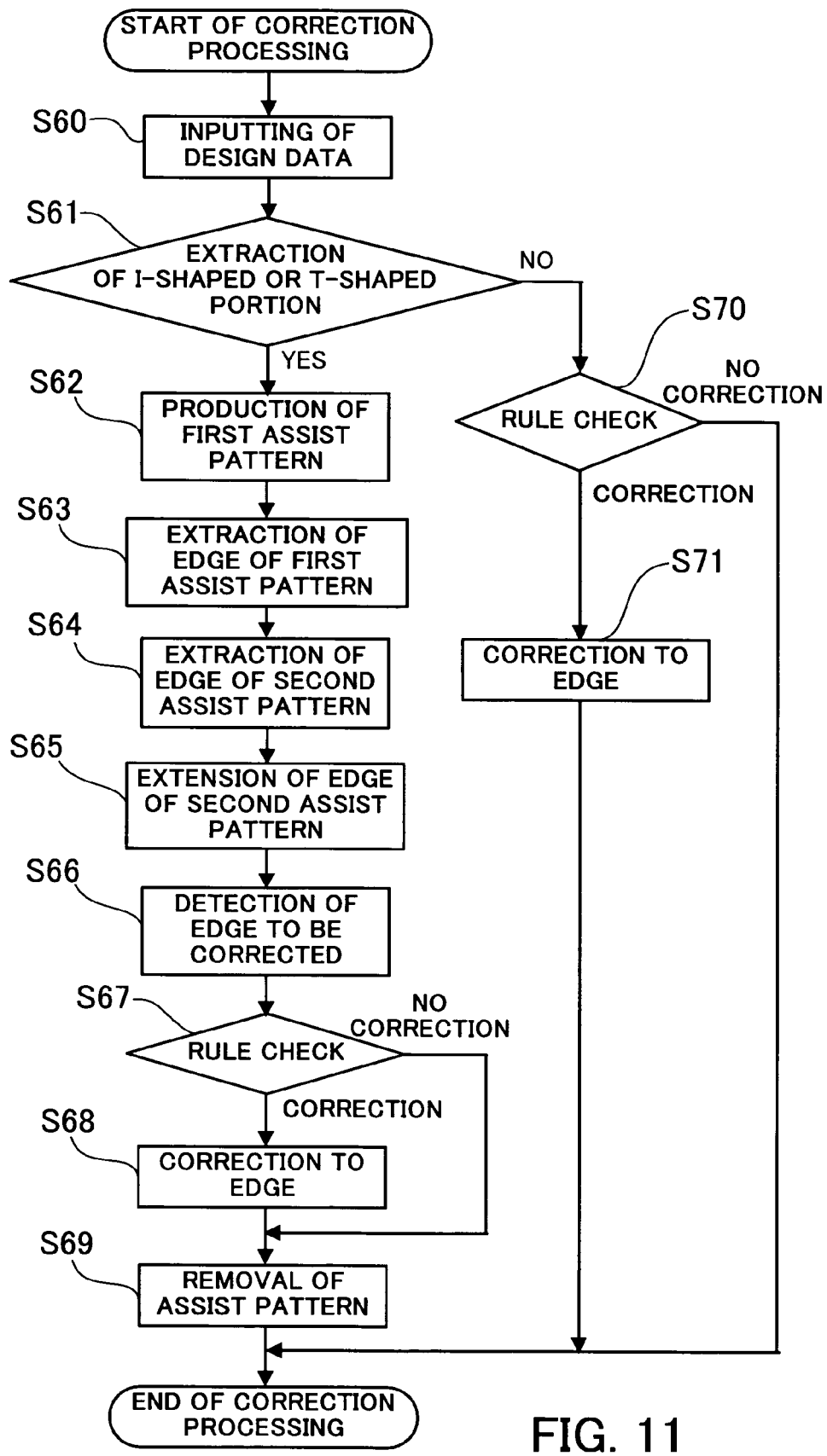
FIG. 11 shows a flowchart indicating a flow of processes of pattern data correcting method of a fourth embodiment of the present invention.

Next, a pattern data correcting method of a fourth embodiment of the present invention is explained. FIG. 11 shows a flowchart indicating a flow of processes of a pattern data correcting method of the fourth embodiment of the present invention. The processes in Steps S60 to S63 in the fourth embodiment are the same as those shown in Steps S10 to S13 in FIG. 4 in the pattern data correcting method of the first embodiment. In the fourth embodiment, the assist pattern to be produced in Step S62 is referred to as a first assist pattern. In the pattern data correcting method of the fourth embodiment, a process in Step S64 is additionally provided which produces a second assist pattern that fills space between the first assist pattern generated in the process in Step S62 and the pattern placed in parallel and near to the first assist pattern.

Figure 12:
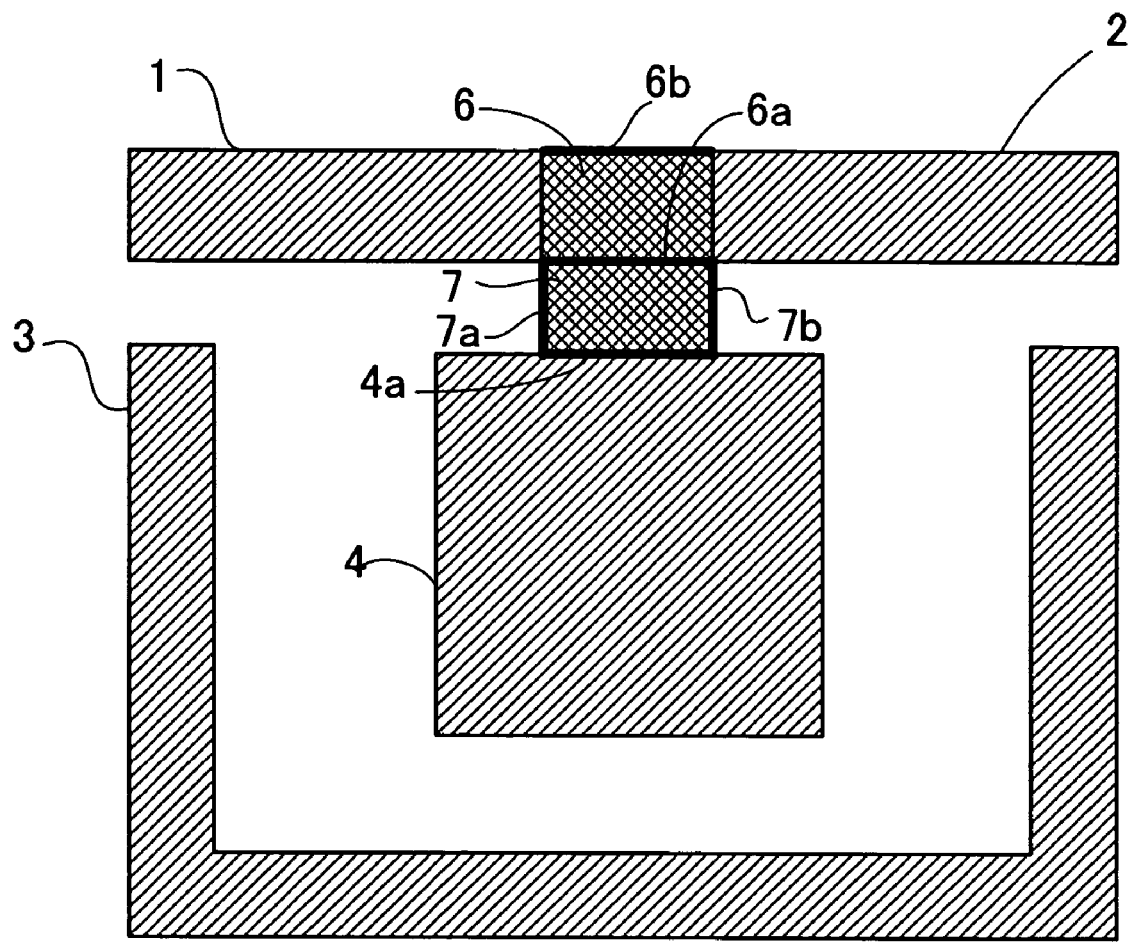
FIG. 12 shows an example of a produced second assist pattern.

FIG. 12 shows an example of a produced second assist pattern. The example is shown in which the second assist pattern 7 to fill the space between the first assist pattern 6 and the pattern 4 is produced. In the pattern data correcting method of the fourth embodiment, as shown in FIG. 12, the edges 7a and 7b of the produced second assist pattern 7 placed in a region in which the first assist pattern 6 is not in contact with the pattern 4 are extracted (Step S65). By extracting the edge region in which the second assist pattern 7 is in contact with the pattern 4, the edge 4a to be corrected can be detected (Step S66). Furthermore, in the rule check in Step S67, by checking a length (that is; butting interval) of each of the edges 6a and 6b and a length (that is; space width) of each of the edges 7a and 7b of the second assist pattern 7, a judgment is made as to whether or not the edge 4a is corrected. Then, if the edge 4a is to be corrected, a correction value is determined according to a length of each of the edges 6a and 6b and a length of each of the edges 7a and 7b, and a correction is made to the edge 4a. After that, the produced first and second assist patterns 6 and 7 are removed (Step S69) and the correction processing is terminated. Moreover, if it is judged that no correction to the edge to be corrected is required, after the completion of the process in Step S69, the correction processing is terminated without making the correction. The processes in Steps S70 and S71 are the same as those in Steps S18 and S19 shown in FIG. 4.

In the pattern data correcting method of the first to fourth embodiments, an assist pattern that fills a space portion having a specified size is first produced and an edge to be corrected is detected according to the produced assist pattern. However, an edge recognized as an isolated pattern may be first extracted. This is explained by using a fifth embodiment below.

Figure 13:
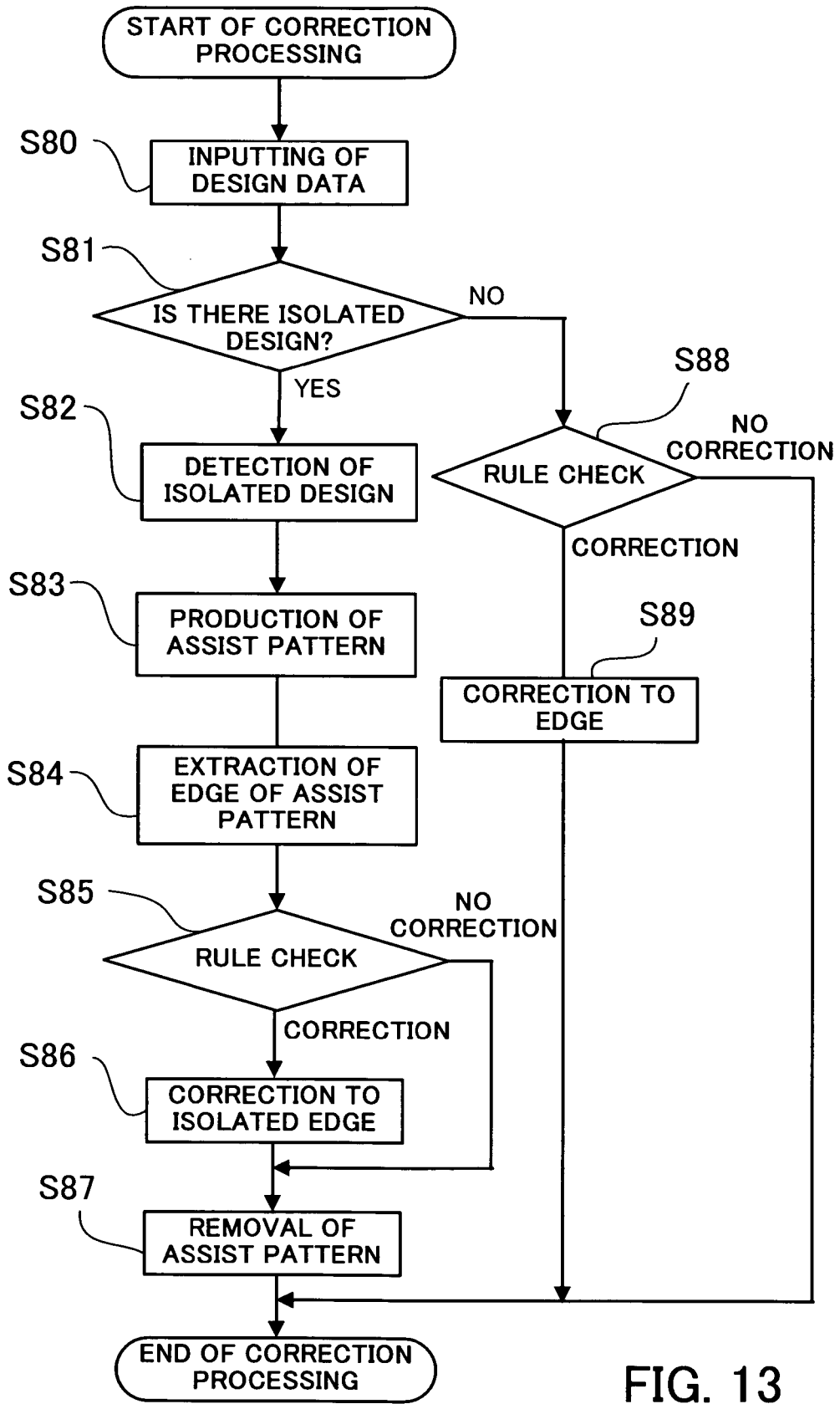
FIG. 13 shows a flowchart indicating a flow of processes of a pattern data correcting method of a fifth embodiment of the present invention.

FIG. 13 shows a flowchart indicating a flow of processes of a pattern data correcting method of the fifth embodiment of the present invention. First, after design data to produce an original drawing is input (Step S80), a judgment is made as to whether or not there is a region (isolated region) in which a space portion exists between patterns facing each other in an edge in framing portions of a pattern within a specified distance in a direction vertical to the edge (Step S81), and if the region exists, the region is detected as an isolated edge (Step S82). Moreover, if it is judged that there is no region meeting conditions, the routine proceeds to Step S88.

Figure 14:
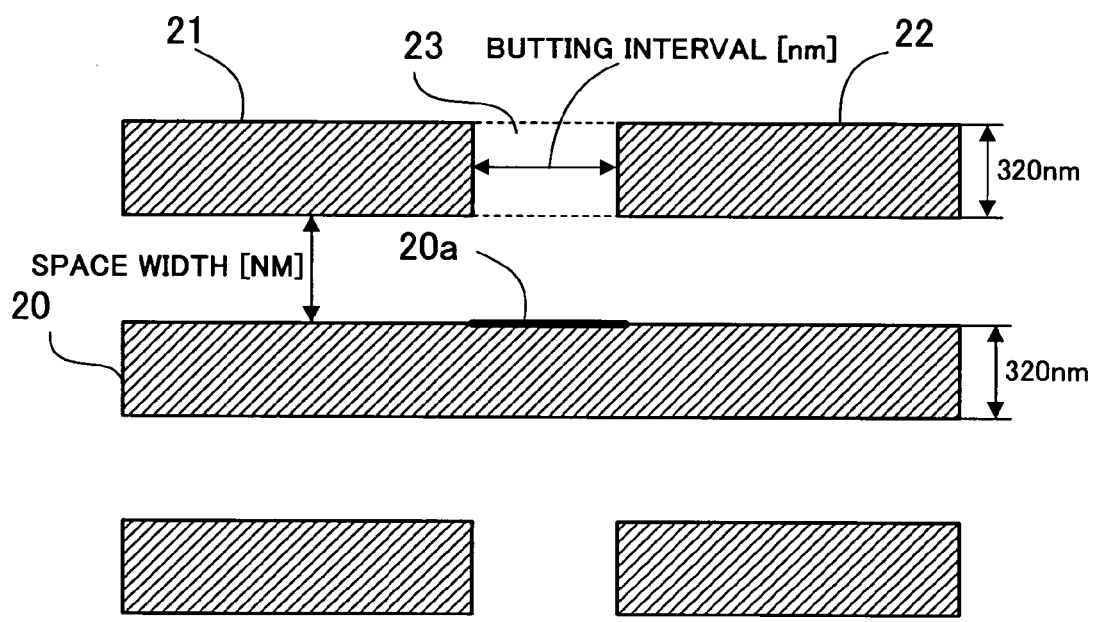
FIG. 14 shows a state in which an isolated edge is detected.

FIG. 14 shows a state in which an isolated edge is detected. Here, an example is shown in which the space portion 23 exists between the patterns 21 and 22 facing each other in a direction vertical to the edge 20a of the pattern 20 and this edge 20a is detected as an isolated edge.

Next, an assist pattern to fill the space portion 23 is produced (Step S83).

Figure 15:
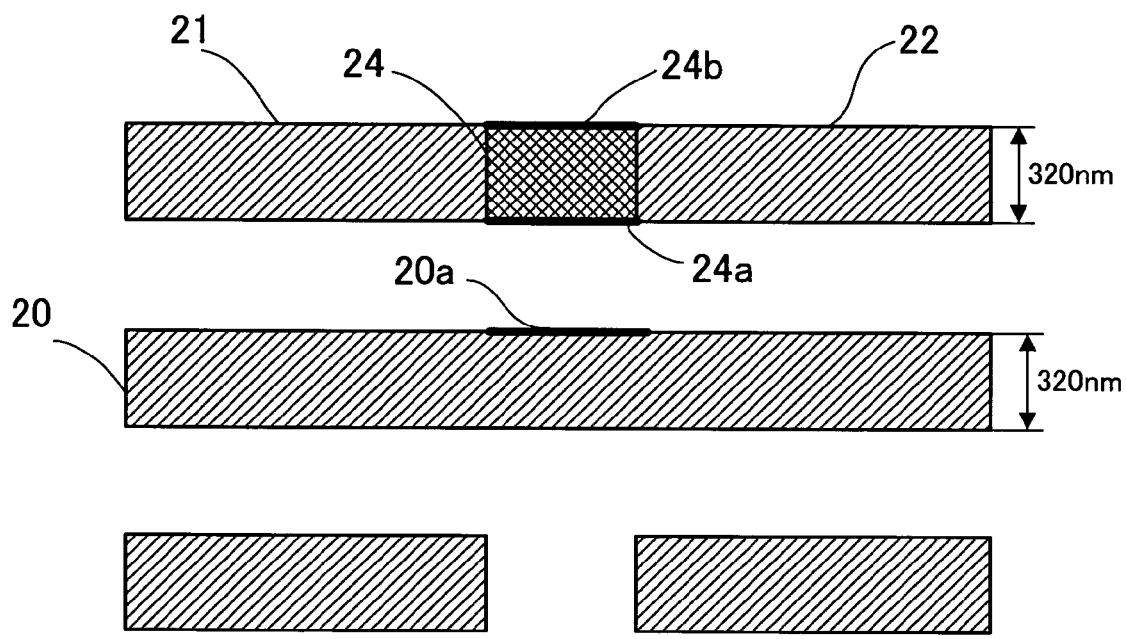
FIG. 15 shows a state in which an assist pattern is produced in a space portion which faces an isolated edge to be corrected.

FIG. 15 shows a state in which an assist pattern is produced in a space portion which faces an isolated edge to be corrected. As shown in FIG. 15, the assist pattern 24 to fill the space portion 23 facing the isolated edge 20a to be corrected that has been detected in Step S82 is produced. After that, the edges 24a and 24b of the assist pattern 24 extending in a direction of a distance between the patterns 21 and 22 facing each other are extracted (Step S84).

Furthermore, in the rule check in Step S85, by checking a length (butting interval) of each of the extracted edges 24a and 24b and an interval between the assist pattern 24 and the isolated edge 20a to be corrected, a judgment is made as to whether or not the isolated edge 20a is corrected.

Here, to explain a specific judgment standard, a result from evaluation is shown on a dimensional characteristic of a region regarded as an isolated region in an edge in framing portions of a pattern.

Figure 16:
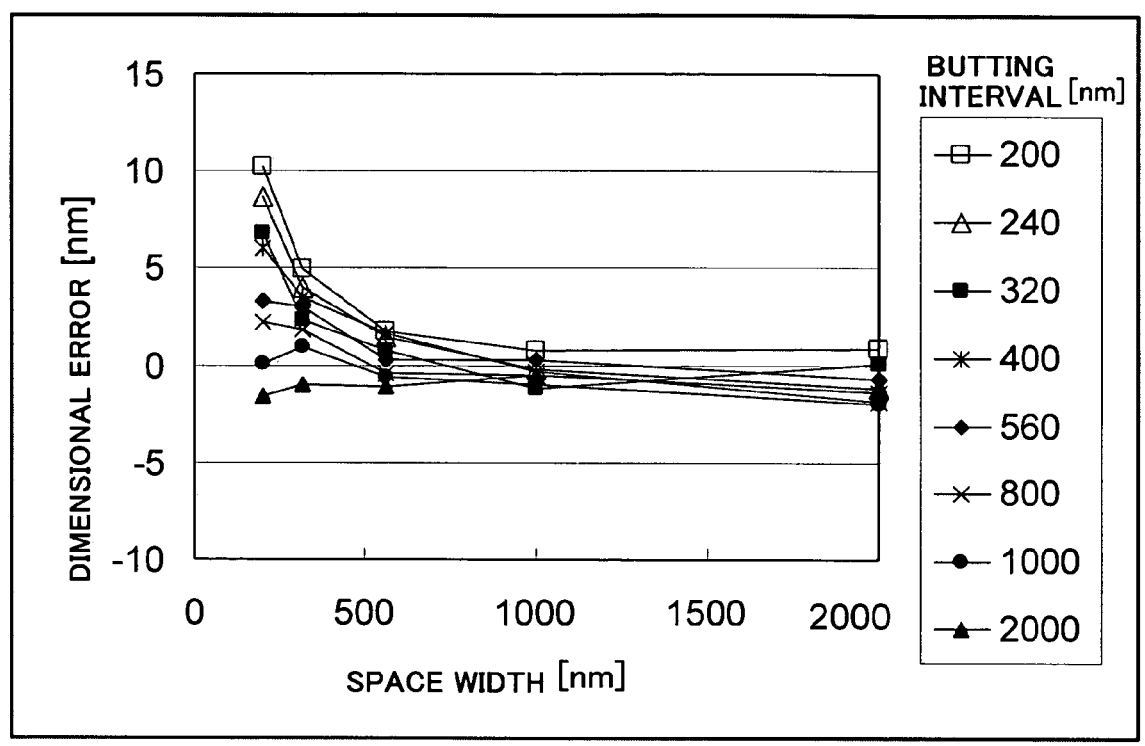
FIG. 16 shows dependency of a pattern on a space width and a butting interval.

FIG. 16 shows dimensional dependency of a pattern on a space width and butting interval. Changes in pattern dimensions are evaluated when the space width is changed for 200 nm, 320 nm, 560 nm, 1000 nm, and 2000 nm and when the butting interval is changed for 200 nm, 240 nm, 320 nm, 400 nm, 560 nm, 800 nm, 1000 nm, and 2000 nm by using the patterns for the evaluation shown in FIG. 14. Moreover, the dimension of the patterns 20, 21, and 22 in the design data is 20 mm.

As is apparent from this graph, if the space width is 1000 nm or more, the region defined as the isolated edge 20a shows a dimensional characteristic as an ordinary isolated region irrespective of a butting interval value. That is, even if the space width is changed, the dimension is kept constant. On the other hand, when the space width is 1000 nm or less, dimensional errors in the region defined as the isolated edge 20a gradually increases, which narrows the interval between the pattern 20 and patterns 21 and 22. That is, if a pattern density in an area surrounding a dimensional measurement point becomes high, an etching speed in the entire region decreases and, as a result, a pattern dimension is made large. Moreover, if the butting interval becomes 2000 nm, even when the space width is made narrow, no increase in the dimensional errors occur.

According to the above evaluation results, in the case of patterns as shown in FIG. 14, when a space portion 23 having the butting interval of 2000 nm or less between the patterns 21 and 22 facing each other exists within about 1000 nm in a direction vertical to the isolated edge 20a, it is judged that a correction is required. Then, when it is judged that a correction to the isolated edge 20a is required, by determining a correction value according to a length of each of the edges 24a and 24b and to an interval between the assist pattern 24 and the isolated edge 20a, the correction is made to the isolated edge 20a (Step S86). After that, the produced assist pattern is removed (Step S87) and the correction processing is terminated. Moreover, if it is judged that no correction to the isolated edge 20a is required, without making the correction, after the process in Step S87, the correction processing is terminated.

On the other hand, in the case of the edge having been judged not to be an isolated edge in the process in Step S81, a judgment is made as to whether the correction is made according to an ordinary proximity-effect correction rule (Line & Space) (Step S88) and, if the correction is made, by using, for example, the table 1 described above, a correction value is determined according to space and line dimensions and the correction is made (Step S89). If it is judged that no correction is required, the correction processing is terminated without making the correction.

In the pattern data correcting method of the first to fifth embodiments, either of the processing in which a correction is made to design data according to an ordinary proximity-effect correction rule (processes in Steps S18, S19, S29, S30, S50, S51, S70, S71, S88 and S89) and the processing in which an edge of a pattern likely to be judged as requiring a correction but as an isolated edge (hereinafter called an apparently isolated edge) is detected and a correction is made according to a rule being independent of a rule to be applied to a correction to other edge (processes in Steps S11 to S17, S21 to S28, S41 to S49, S61 to S69, and S81 to S87) is selected depending on conditions. However, the processing in which a correction is made to such an apparently isolated edge as above according to a rule being independent of a rule to be applied to a correction to other edge may be applied to data having been corrected first by using the ordinary proximity-effect correction rule.

Next, a pattern data correcting method of a sixth embodiment is explained.

Figure 17:
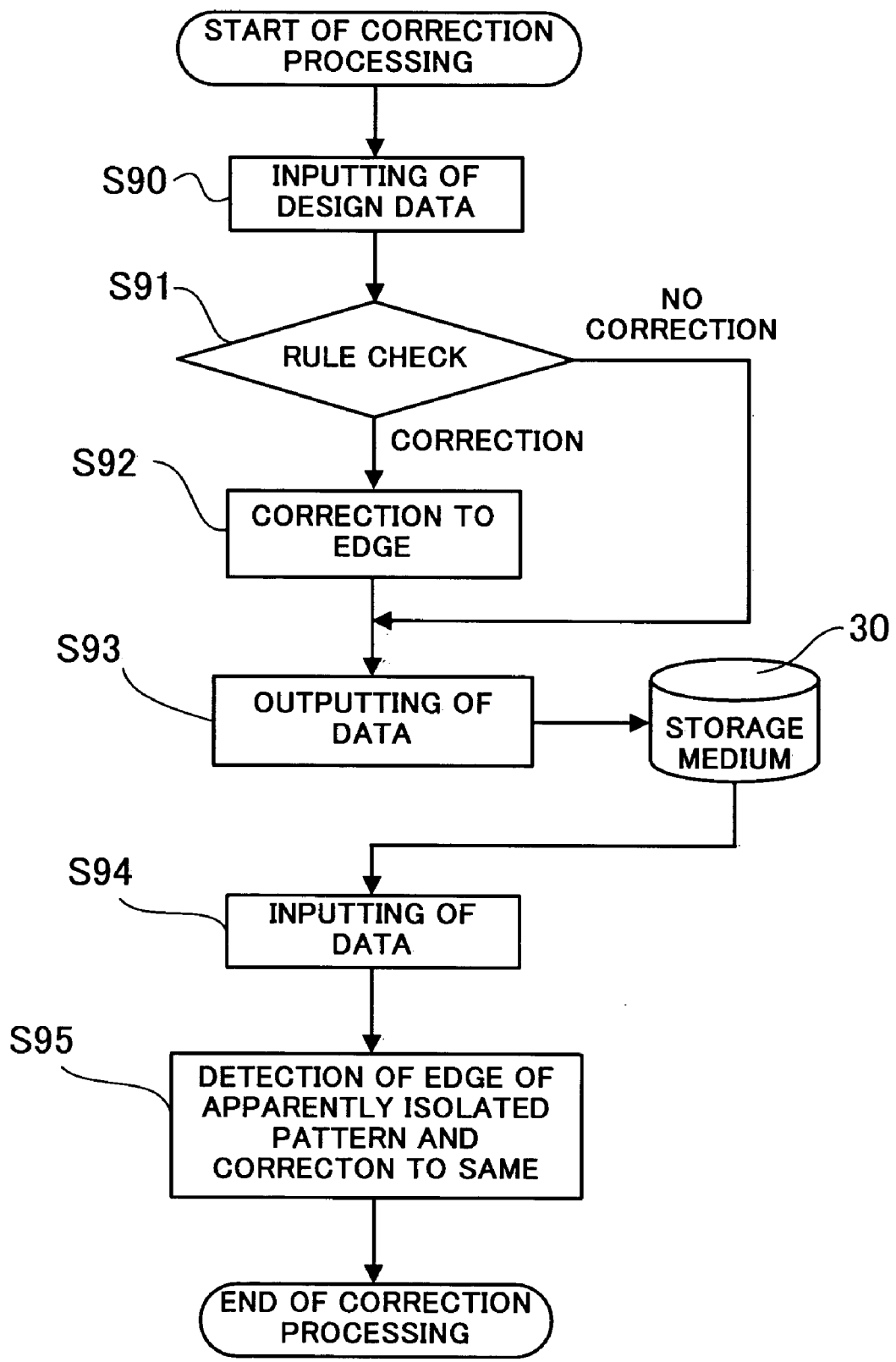
FIG. 17 shows a flowchart indicating a flow of processes of a pattern data correcting method of a sixth embodiment of the present invention.

FIG. 17 shows a flowchart indicating a flow of processes of a pattern data correcting method of the sixth embodiment of the present invention.

First, when design data to produce an original drawing is input (Step S90), an judgment is made as to whether or not a correction is made according to the ordinary proximity-effect correction rule (Line & Space)(Step S91) and, if the correction is made, a correction value is determined and according to space and line dimensions, and the correction is made (Step S92). When the correction was made and, if it is judged that no correction to the corrected data is required, the original design data is output to a storage medium 30 such as a hard disk drive or the like without making the correction (Step S93).

Figure 18:
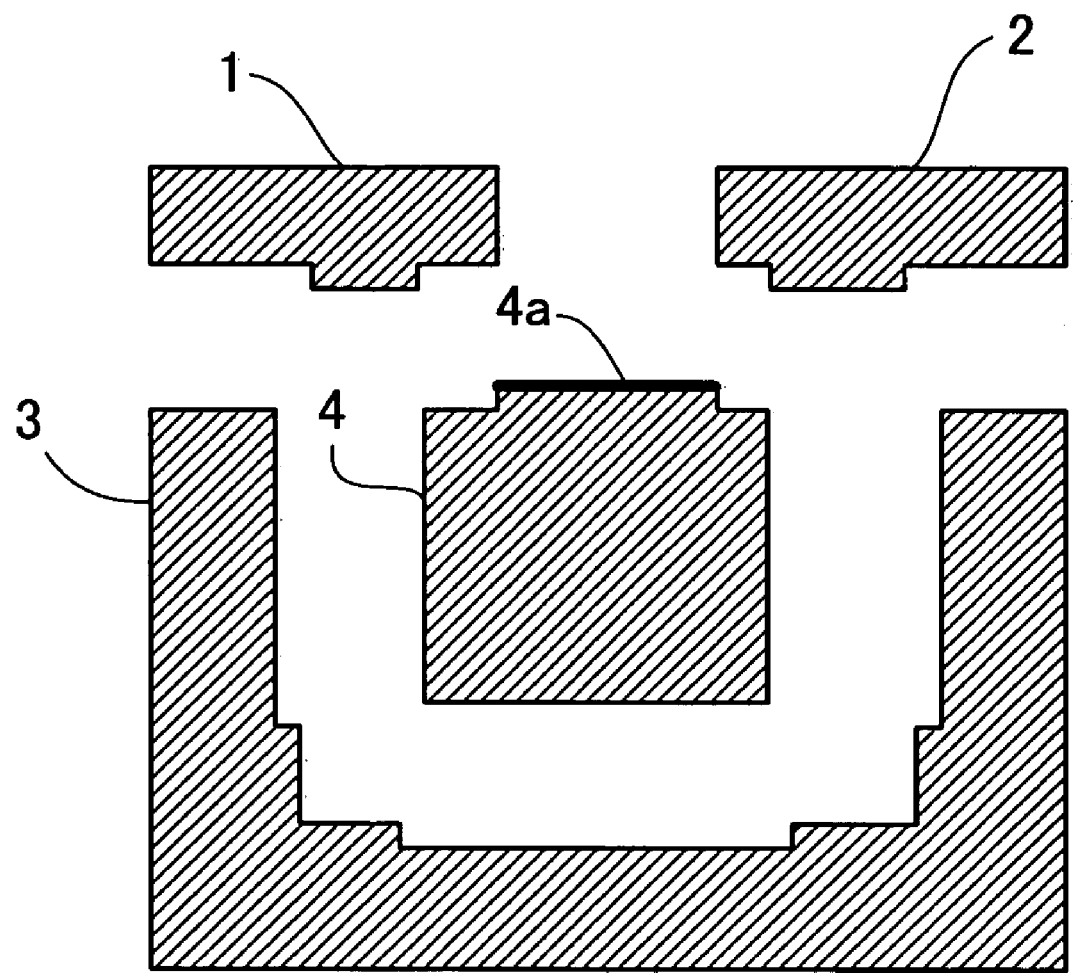
FIG. 18 shows an example of a pattern corrected according to space and line dimensions.

FIG. 18 shows an example of a pattern corrected according to space and line dimensions. One example is shown in FIG. 18 in which a correction is made to the patterns shown in FIG. 2 according to space and line dimensions. As shown in FIG. 18, there is such an edge as the edge 4a of the pattern 4 whose width is made large by an influence of being recognized as an apparently isolated edge. In order to make a correction to such an edge as above, by inputting data stored in the storage medium 30 to detect an edge of an apparently isolated pattern described above and the processing (processes in Steps S11 to S17, S21 to S28, S41 to S49, S61 to S69, and S81 to S87) is performed in which a correction is made according to a rule being independent of a rule to be applied to a correction to other edge (Step S95). Moreover, if an I-shaped portion or T-shaped portion in the processing (in Steps S11, S21, S41, and S61) of extracting the I-shaped or T-shaped portion to be performed in the pattern data correcting method of the first to fourth embodiments is not detected, or an isolated region in the processing (in Step S81) of detecting the isolated region to be performed in the fifth embodiment is not detected, the processing is terminated without making a correction.

Thus, by applying the pattern data correcting method of the first to sixth embodiment, a mask obtained by making a proper correction to data of a pattern having a complicated layout and affected by a proximity effect can be produced.

Finally, an example is described in which the mask produced by using the pattern data correcting method as explained above is applied to actual manufacturing of a semiconductor device.

Figure 19:
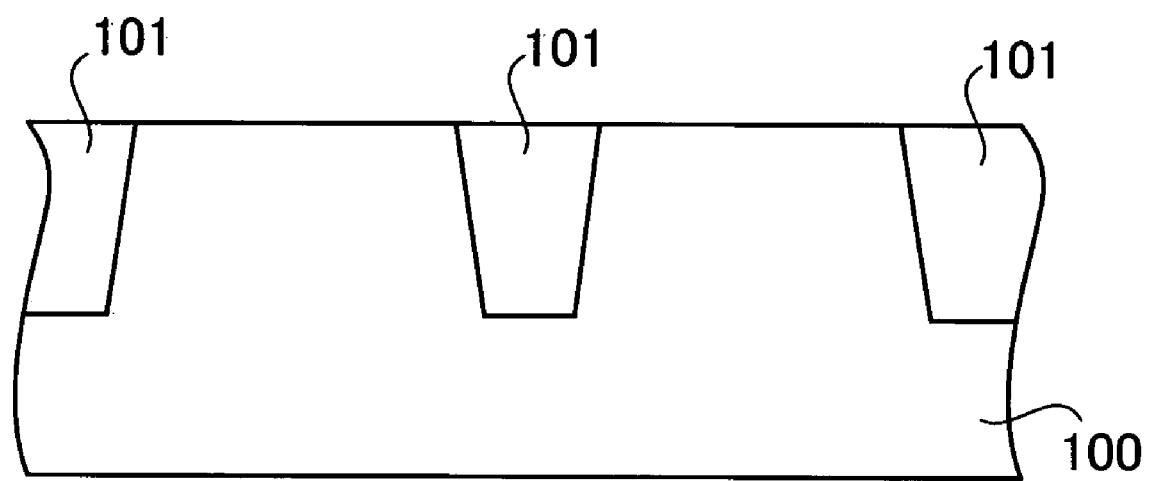
FIG. 19 shows a cross-sectional view explaining one process of manufacturing a semiconductor (first).

FIGS. 19, 20, 21, and 22 show cross-sectional views explaining processes of manufacturing a semiconductor. First, as shown in FIG. 19, device isolation films 101 are formed in a silicon substrate 100, by using an STI (Shallow Trench Insolation) method, in a manner in which each of the device isolation films 101 is buried in a trench with a depth of, for example, 300 nm. In FIG. 19, an N-type transistor is formed in a device region on a left side on the drawing and a P-type transistor in a device region on a right side on the drawing.

Figure 20:
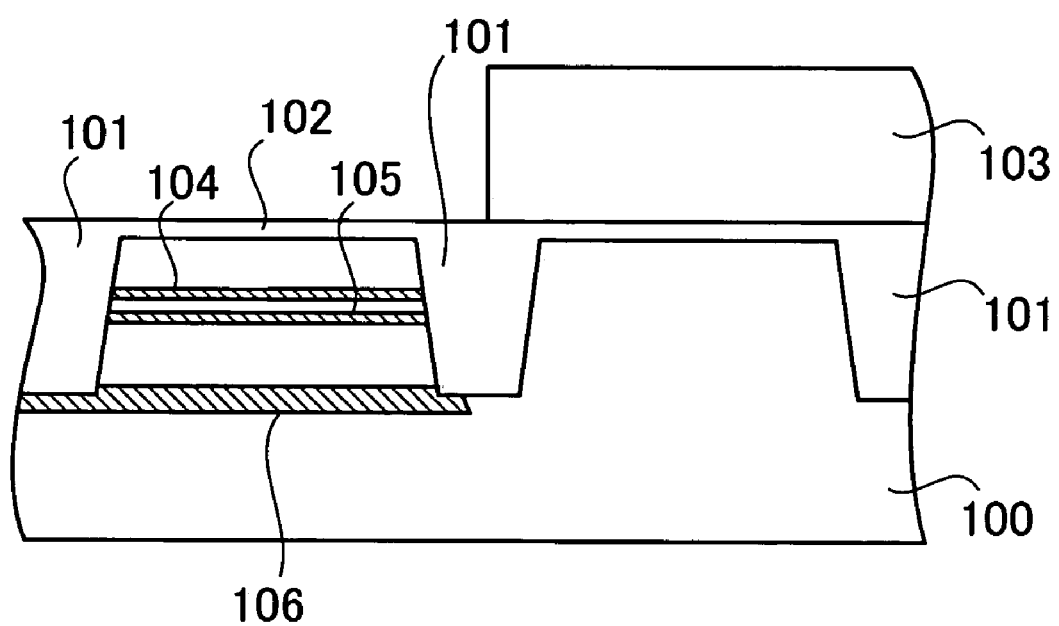
FIG. 20 shows a cross-sectional view explaining one process of manufacturing a semiconductor (second).

Next, as shown in FIG. 20, a sacrificial oxide film 102 is formed, for example, by a thermal oxidation method, on a device region partitioned by the device isolation films 101. Then, by photolithography, a photoresist film 103 is formed so that an N-type transistor forming region is exposed and a P-type transistor forming region is buried. Furthermore, by using the photoresist film 103 as a mask, ion implantation is performed to form P-type impurity diffused regions 104, 105, and 106 in the silicon substrate 100 in the N-type transistor forming region. The P-type impurity diffused region 104 is formed by the implantation of, for example, indium ion ($In^+$) with accelerated energy of 60 keV and in a dose of $1 \times 10^{13}$ $cm^{-2}$. Also, the P-type impurity diffused region 105 is formed by the implantation of, for example, indium ion ($In^+$) with accelerated energy of 180 keV and in a dose of $3 \times 10^{13}$ $cm^{-2}$. The P-type impurity diffused region 106 is formed by the implantation of, for example, boron ion ($B^+$) with accelerated energy of 150 keV and in a dose of $3 \times 10^{13}$ $cm^{-2}$.

Figure 21:
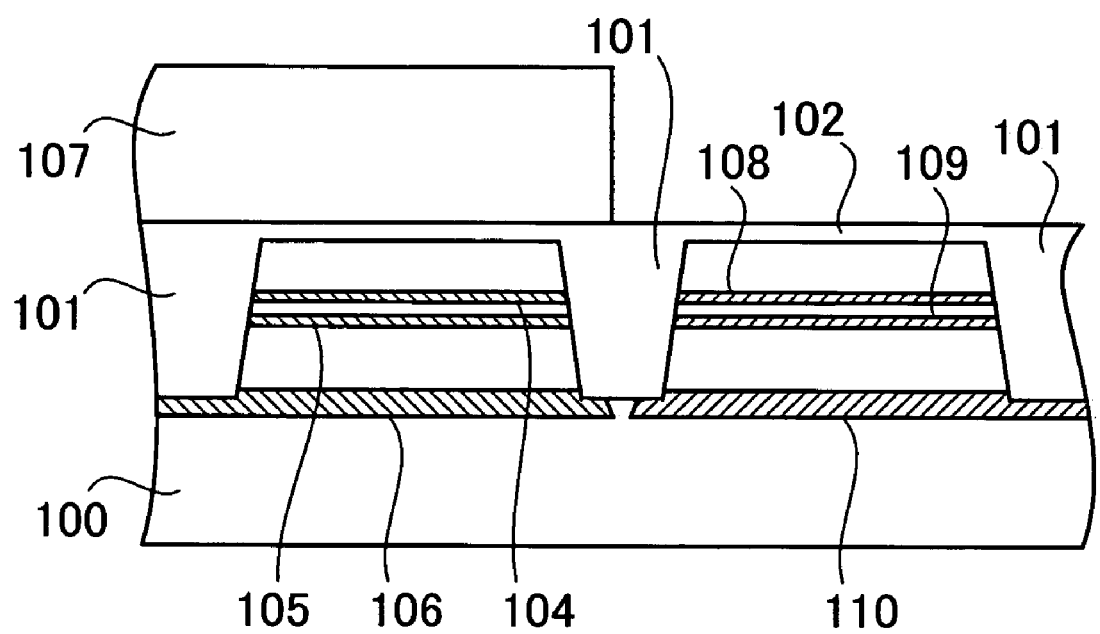
FIG. 21 shows a cross-sectional view explaining one process of manufacturing a semiconductor (third).

Next, as shown in FIG. 21, by photolithography, a photoresist film 107 is formed so that the P-type transistor forming region is exposed and the N-type transistor forming region is buried. Then, by using the photoresist film 107 as a mask, ion implantation is carried out to form N-type impurity diffused regions 108, 109, and 110 in the silicon substrate 100 in the P-type transistor forming region.

The N-type impurity diffused region 108 is formed by the implantation of, for example, arsenic ion ($As^+$) with accelerated energy of 100 keV and in a dose of $5 \times 10^{12}$ $cm^{-2}$. Also, the N-type impurity diffused region 109 is formed by the implantation of, for example, arsenic ion ($As^+$) with accelerated energy of 150 keV and in a dose of $5 \times 10^{13}$ $cm^{-2}$. The N-type impurity diffused region 110 is formed by the implantation of, for example, phosphorus ion ($P^+$) with accelerated energy of 300 keV and in a dose of $3 \times 10^{13}$ $cm^{-2}$.

Figure 22:
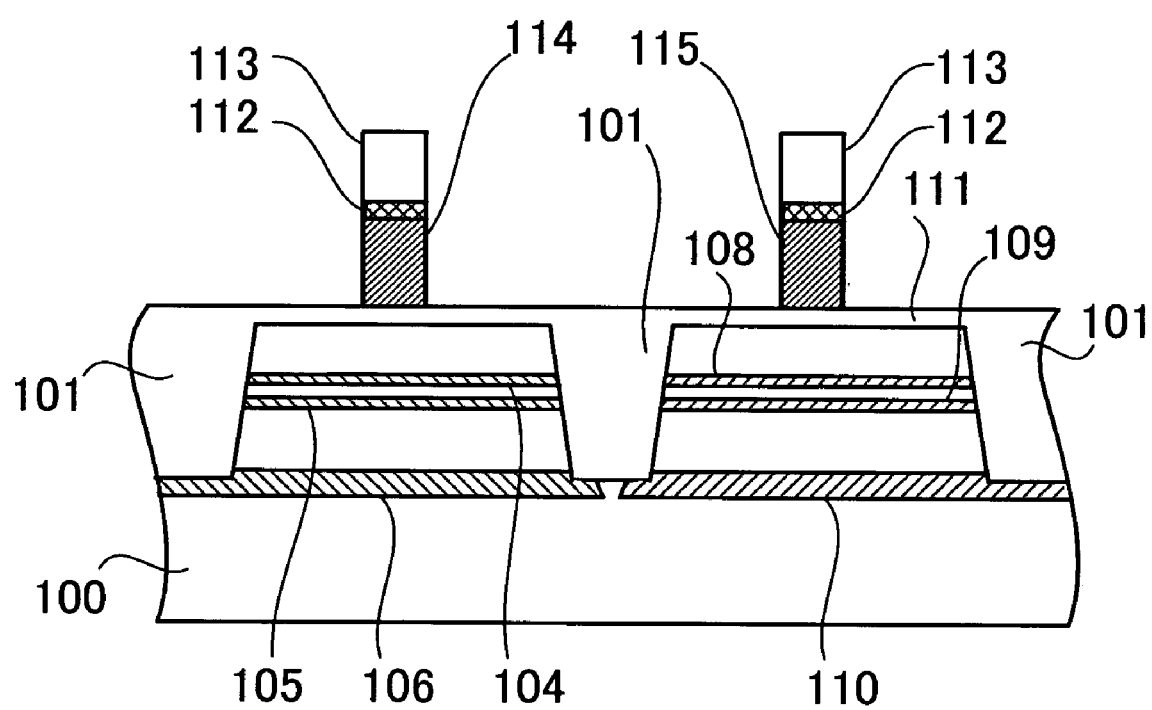
FIG. 22 shows a cross-sectional view explaining one process of manufacturing a semiconductor (fourth).

Next, by carrying out wet-etching using, for example, a hydrofluoric water solution, the sacrificial oxide film 102 is removed. Then, for example, by the thermal oxidation method, a silicon oxide film with a film thickness of, for example, 11 nm is made to grow on a device region that is exposed by the removal of the sacrificial oxide film 102 and, as shown in FIG. 22, a gate insulating film 111 made of a silicon oxide film is formed. Then, a polycrystalline silicon film (not shown) with a film thickness of, for example, 100 nm is deposited on the gate insulating film 111, for example, by a CVD (Chemical Vapor Deposition) method. Next, an organic anti-reflection film 112 is applied on the polycrystalline silicon film so that its film thickness is about 80 nm and, furthermore, an ArF (Argon Fluoride) posi-type resist serving as a photosensitive material is applied thereon so that its thickness is about 250 nm to 300 nm.

By a stepper using an ArF exima laser as a light source, exposures of a pattern for a mask produced by the pattern data correcting method in the first to sixth embodiments are performed on the wafer substrate in the state described above. The exposure is performed under conditions of a numerical aperture (NA) being 0.7, ½ zonal illumination (σ value:0.425/0.85), and an amount of exposure being 210 $J/cm^2$.

Next, by thermal treatment as a post exposure baking (PEB) process and developing processing, a resist pattern 113 is formed. Then, by using the resist pattern 113 as a mask, the anti-reflection film 112, the polycrystalline silicon film (not shown), and the gate insulating film 111 are etched to form gate electrodes 114 and 115 made up of a polycrystalline silicon film. Here, the gate electrode 114 serves as a gate electrode of an N-type transistor and the gate electrode 115 serves as a gate electrode of a P-type transistor.

Thus, a study on uniformity in pattern dimensions of the gate electrodes 114 and 115 formed by using the pattern data correcting method employed in the first to sixth embodiments shows that dimensional uniformity obtained by using the mask produced by the pattern data correcting method of the present invention is improved by about 4 nm in length when compared with the case of using the conventional mask.

Moreover, in all the above first to sixth embodiments, the pattern data correcting method is applied when a correction is made to a pattern formed on a mask. However, the pattern data correcting method of the present invention can be also applied when the correction is to be made to data of a pattern which is affected by a proximity effect and is formed on a wafer.

According to the present invention, since a space portion being formed on a photomask or a wafer and having a specified size occurring between patterns facing each other in a first direction is detected according to design data, pattern data corresponding to an assist pattern that fills the space portion is produced, an edge to be corrected placed in a position being opposite to an edge of an assist pattern extending in a second direction between patterns facing each other, out of framing portions of the pattern positioned in parallel and near to the assist pattern, is detected, and a correction being independent of a correction to be made to other edge in the framing portion of the pattern is made to an edge to be corrected, it is possible to make a proper correction to even an edge which is ordinarily recognized as an isolated pattern and to which a proper correction is not made.

Also, since a region where a space portion occurring between second patterns facing each other, out of edges in framing portions of the second pattern, exists is extracted as an isolated edge, pattern data corresponding to an assist pattern that fills the space portion is produced, an edge of an assist pattern extending in a second direction of a distance between the first and second patterns facing each other is extracted, and a correction is made to the isolated edge according to a length of the extracted assist pattern and to an interval between the assist pattern and the above isolated edge, it is possible to make a proper correction to even an edge which is ordinarily recognized as an isolated pattern and to which a proper correction is not made.

Furthermore, by applying a photomask formed by using the above methods to a process of manufacturing a semiconductor device, it is made possible to form a desired microfabricated pattern.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A pattern data correcting method for making a correction to pattern data affected by a proximity effect when a pattern is formed on a photomask or wafer according to design data for a semiconductor device, comprising the steps of:

detecting, according to said design data, a space portion on said photomask or wafer and having a specified size occurring between first and second patterns facing each other;

producing pattern data corresponding to an assist pattern that fills said space portion;

detecting, on a third pattern near to said assist pattern, an edge to be corrected in a position out of framing portions of said third pattern and opposite to and parallel with an edge of said assist pattern, said edge of said assist pattern extending in a direction between said first and second patterns facing each other;

making a correction to the detected edge, said correction being independent of a correction made to an other edge of said third pattern; and removing said assist pattern.

2. The pattern data correcting method according to claim 1, wherein said pattern data corresponding to said assist pattern is defined by a layer or a variable different from that for said design data.

3. The pattern data correcting method according to claim 1, wherein said space portion is a region between said first and second patterns, which face each other in a T-shaped or an I-shaped manner.

4. The pattern data correcting method according to claim 1, wherein said edge to be corrected is detected by extracting a region in a position opposite to said edge of said assist pattern and having a length the same as that of said edge of said assist pattern.

5. The pattern data correcting method according to claim 1, wherein said edge to be corrected is detected by moving said edge of said assist pattern so as to come in contact with said edge to be corrected and extracting a region of said edge of said assist pattern which is in contact with said edge to be corrected to detect said edge to be corrected.

6. The pattern data correcting method according to claim 1, wherein said edge to be corrected is detected by extending two lines out from said assist pattern, said two lines being perpendicular to said edge of said assist pattern extending in direction between said first and second patterns and by extracting a region formed between two points where said two lines contact with said third pattern.

7. The pattern data correcting method according to claim 6, wherein a correction value for said edge to be corrected is determined according to an angle formed between one of said two lines with said edge to be corrected.

8. The pattern data correcting method according to claim 1, further comprising a step of forming a second assist pattern that fills a space between said assist pattern and said third pattern and located in parallel with and near to said assist pattern, wherein said edge to be corrected is detected by extracting a region where said second assist pattern is in contact with said third pattern.

9. The pattern data correcting method according to claim 1, wherein processing in each step is performed on design data having been corrected according to predetermined rules.

10. The pattern data correcting method according to claim 9, wherein said predetermined rules are correcting rules according to which a correction value is determined according to a line dimension of said third pattern and to a space dimension between said patterns.

11. A pattern data correcting method for making a correction to pattern data affected by a proximity effect when a pattern is formed on a photomask or wafer according to design data for a semiconductor device, comprising the steps of:

detecting an isolated edge region out of framing portions of a first pattern, in which a space width occurring between a second pattern and a third pattern facing each other and said first pattern exists within a specified distance;

producing pattern data corresponding to an assist pattern that fills a space portion between said second and third patterns;

extracting an edge of said assist pattern extending between said second and third patterns facing each other in a second direction;

making a correction to data of said isolated edge according to a length of said edge of said assist pattern and an interval between said assist pattern and said isolated edge; and removing said assist pattern.

12. The pattern data correcting method according to claim 11, wherein said pattern data corresponding to said assist pattern is defined by a layer or a variable which is different from that for said design data.

13. The pattern data correcting method according to claim 11, wherein processing in each step is performed on design data having been corrected according to predetermined rules.

14. The pattern data correcting method according to claim 13, wherein said predetermined rules are correcting rules according to which a correction value is determined according to a line dimension of said first pattern and to a space dimension between said second and third patterns.

15. A method for manufacturing a semiconductor device comprising:

forming a photomask by detecting, according to said design data, a space portion on said photomask or wafer and having a specified size occurring between first and second patterns facing each other, producing pattern data corresponding to an assist pattern that fills said space portion, detecting, on a third pattern near to said assist pattern, an edge to be corrected in a position out of framing portions of said third pattern and opposite to and parallel with an edge of said assist pattern, said edge of said assist pattern extending in a direction between said first and second patterns facing each other, making a correction to the detected edge to be corrected, said correction being independent of a correction made to an other edgeof said third pattern, and removing said assist pattern; and performing an exposure by using said photomask.

16. A method for manufacturing a semiconductor device comprising:

forming a photomask by detecting an isolated edge region out of framing portions of a first pattern, in which a space width occurring between a second pattern and a third pattern facing each other and said first pattern exists within a specified distance, producing pattern data corresponding to an assist pattern that fills a space portion between said second and third patterns, extracting an edge of said assist pattern extending between said second and third patterns facing each other in a second direction, making a correction to data of said isolated edge according to a length of said edge of said assist pattern and an interval between said assist pattern and said isolated edge, and removing said assist pattern; and performing an exposure by using said photomask.

* * * * *